(12) United States Patent
Clark et al.

(10) Patent No.: US 9,837,304 B2
(45) Date of Patent: Dec. 5, 2017

(54) SIDEWALL PROTECTION SCHEME FOR CONTACT FORMATION

(71) Applicant: Tokyo Electron Limited, Minato-ku, Tokyo (JP)

(72) Inventors: Robert D. Clark, Livermore, CA (US); Kandabara N. Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/191,912

(22) Filed: Jun. 24, 2016

(65) Prior Publication Data

US 2016/0379870 A1    Dec. 29, 2016

Related U.S. Application Data

(60) Provisional application No. 62/184,003, filed on Jun. 24, 2015.

(51) Int. Cl.
| | |
|---|---|
| *H01L 21/768* | (2006.01) |
| *H01L 21/02* | (2006.01) |
| *H01L 21/306* | (2006.01) |
| *H01L 21/311* | (2006.01) |

(52) U.S. Cl.
CPC .. *H01L 21/76814* (2013.01); *H01L 21/02063* (2013.01); *H01L 21/02178* (2013.01); *H01L 21/02181* (2013.01); *H01L 21/02186* (2013.01); *H01L 21/02189* (2013.01); *H01L 21/02271* (2013.01); *H01L 21/30604* (2013.01); *H01L 21/31122* (2013.01)

(58) Field of Classification Search
CPC ......... H01L 21/76814; H01L 21/30604; H01L 21/02063; H01L 21/02271; H01L 21/02178; H01L 21/02181; H01L 21/02189; H01L 21/02186; H01L 21/31122

See application file for complete search history.

(56) References Cited

U.S. PATENT DOCUMENTS

| | | |
|---|---|---|
| 4,707,218 A | 11/1987 | Giammarco et al. |
| 7,671,394 B2 | 3/2010 | Booth et al. |
| 2001/0002331 A1 | 5/2001 | Miyata |
| 2003/0064585 A1 | 4/2003 | Wu et al. |

(Continued)

OTHER PUBLICATIONS

Satyanarayana Myneni (Post Plasma Etch Residue Removal Using Carbon Dioxide Based Fluids, a dissertation) (2004)(204 pages).*

*Primary Examiner* — Nadine Norton
*Assistant Examiner* — Mahmoud Dahimene

(57) ABSTRACT

Method of manufacturing a semiconductor device is described that uses sidewall protection of a recessed feature to prevent loss of critical dimension during a cleaning process to remove etch residue. According to one embodiment, the method includes providing a substrate containing a film thereon having a recessed feature with a sidewall and a bottom portion, depositing a conformal film on the sidewall and on the bottom portion, removing the conformal film from the bottom portion in an anisotropic etching process, where the remaining conformal film forms a protection film on the sidewall, and performing a cleaning process that removes etch residue from the recessed feature without etching the protection film or the sidewall.

20 Claims, 21 Drawing Sheets

(56) References Cited

U.S. PATENT DOCUMENTS

| | | | |
|---|---|---|---|
| 2006/0049132 A1* | 3/2006 | Wu | C09K 13/08 216/17 |
| 2008/0258237 A1* | 10/2008 | Kim | H01L 21/823412 257/396 |
| 2009/0286402 A1 | 11/2009 | Xia et al. | |
| 2011/0248326 A1 | 10/2011 | Kanakasabapathy et al. | |
| 2013/0115778 A1 | 5/2013 | Xue et al. | |
| 2015/0235859 A1* | 8/2015 | Armbruster | H01L 21/02118 438/696 |

\* cited by examiner

SIDEWALL PROTECTION SCHEME FOR CONTACT FORMATION

CROSS-REFERENCE TO RELATED APPLICATIONS

This application is related to and claims priority to U.S. Provisional Application No. 62/184,003, filed Jun. 24, 2015, the entire contents of which are herein incorporated by reference.

FIELD OF INVENTION

The present invention relates to the field of semiconductor manufacturing and semiconductor devices, and more particularly, to sidewall protection to prevent loss of critical dimension during a cleaning process.

BACKGROUND OF THE INVENTION

Current and future generations of metal-oxide-semiconductor field-effect transistors (MOSFETs) require tight control of parasitic capacitance while simultaneously optimizing metal-semiconductor contact resistance. In FinFET structures, maximizing the contact area can be achieved by creating a contact that wraps around the fin or by growing faceted epitaxial contacts, and then wrapping metal around the faceted epitaxial contact. For both MOSFET and FinFET processing, extensive etching and cleaning is required and generally these processes increase the critical dimension (CD) of the recessed feature or contact (via) hole. For back end of line (BEOL) optimization, it is likewise important to etch/clean through via holes without degrading via hole CD.

Reactive ion etching (RIE) is commonly used for etching recessed features in substrates and films. However, it is known that the RIE leaves fluorocarbon residues on the exposed surface after etching of silicon dioxide layers. These residues can be nonvolatile, chemically and thermally stable, and if not removed, they can result in high contact resistance and degradation of interfacial quality. Common residue removal processes include plasma cleaning in combination with a wet cleaning or a wet step alone. Fluorocarbon residues can, for example, be removed using an oxygen plasma that oxidizes the residues to form oxides (e.g., $SiO_x$). Thereafter, the oxides may be removed using an aqueous HF solution. Although this type of residue removal is very effective, Si or SiOx consumption from the sidewall of the recessed features can result in an increase in the CD of the recessed features.

SUMMARY OF THE INVENTION

Embodiments of the invention provide sidewall protection of recessed features to prevent loss of CD during a cleaning process to remove etch residues.

According to one embodiment, a method is provided for processing a substrate. The method includes providing a substrate containing a film thereon having a recessed feature with a sidewall and a bottom portion, depositing a conformal film on the sidewall and on the bottom portion, removing the conformal film from the bottom portion in an anisotropic etching process, where the remaining conformal film forms a protection film on the sidewall, and performing a cleaning process that removes residue from the recessed feature without etching the protection film or the sidewall.

According to another embodiment the method providing a substrate containing a film thereon having a recessed feature with a sidewall and an etch stop layer forming a bottom portion of the recessed feature, depositing a conformal metal oxide film by atomic layer deposition (ALD) on the sidewall and on the bottom portion, removing the conformal metal oxide film from the bottom portion in an anisotropic etching process, where the remaining conformal metal oxide film forms a protection film with a thickness of about 2 nm or less on the sidewall, and performing a cleaning process that removes etch residue from the recessed feature without etching the protection film or the sidewall.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 5A-5F show experimental results for forming a $HfO_2$ protection film in recessed features according to an embodiment of the invention;

FIGS. 6A-6F show experimental results for forming an $Al_2O_3$ protection film in recessed features according to an embodiment of the invention;

DETAILED DESCRIPTION OF SEVERAL EMBODIMENTS

Embodiments of the invention provide a method for sidewall protection to prevent loss of CD during a cleaning process.

Figure 1:
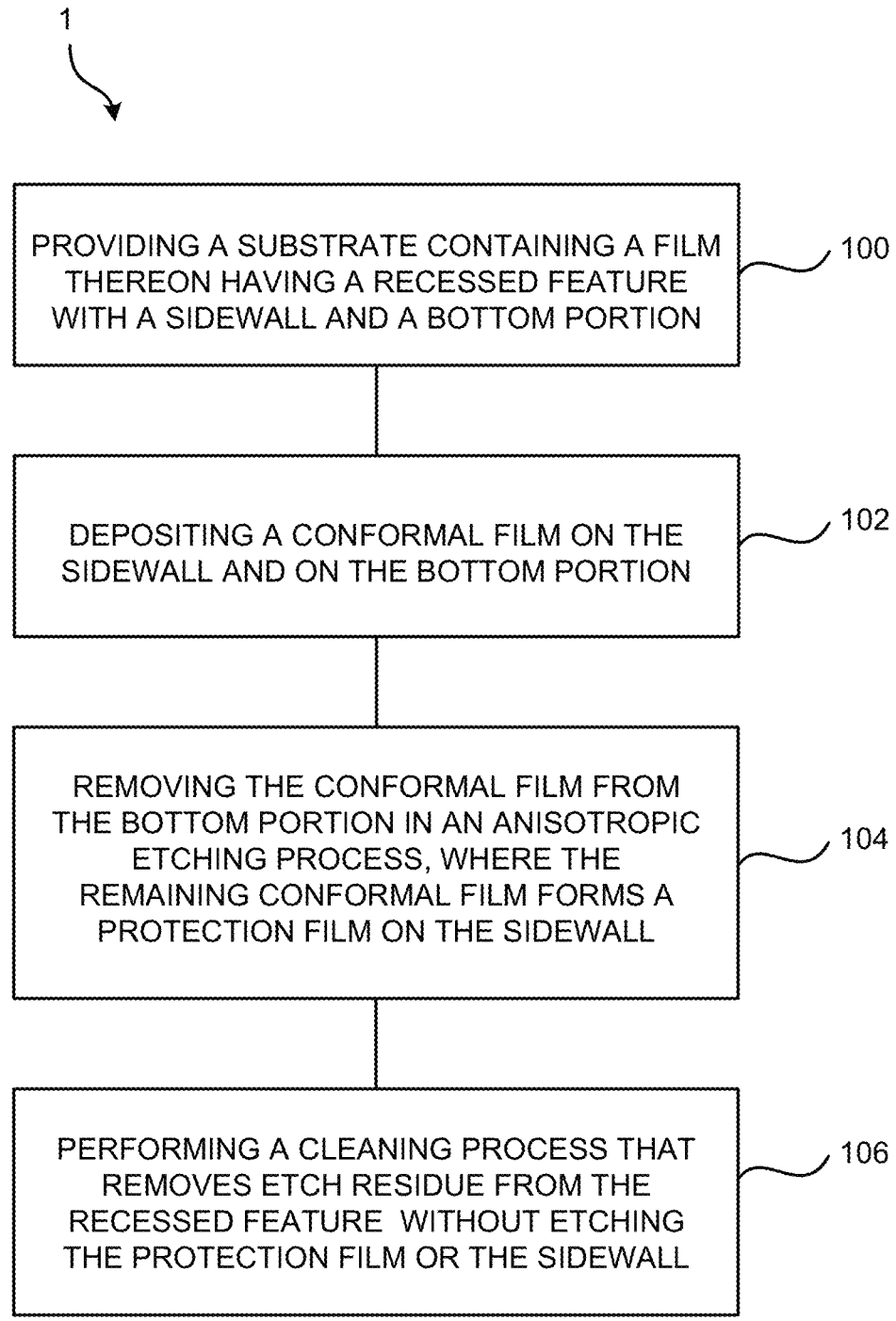
FIG. 1 is a process flow diagram for processing a substrate according to an embodiment of the invention.

FIG. 1 is a process flow diagram for processing a substrate according to an embodiment of the invention, and FIGS. 2A-2E schematically show through cross-sectional views a method of processing a substrate according to an embodiment of the invention. The process flow 1 includes in 100, providing a substrate 200 containing a film 202 thereon having a recessed feature 204 with a sidewall 201 and a bottom portion 203. The recessed feature 204 can, for example, have a width 207 that is less than 200 nm, less than 100 nm, less than 50 nm, less than 25 nm, less than 20 nm, or less than 10 nm. In other examples, the recessed feature 204 can have a width 207 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The width 207 can also be referred to as a CD of the recessed feature 204. The recessed feature 204 can, for example, have a depth of 25 nm, 50 nm, 100 nm, 200 nm, or greater than 200 nm.

In some examples, the substrate 200 and/or the film 202 may consist of Si. In some examples, the film 202 may contain a dielectric material, for example $SiO_2$, SiON, SiN, a high-k material, a low-k material, or an ultra-low-k material.

Figure 2A:
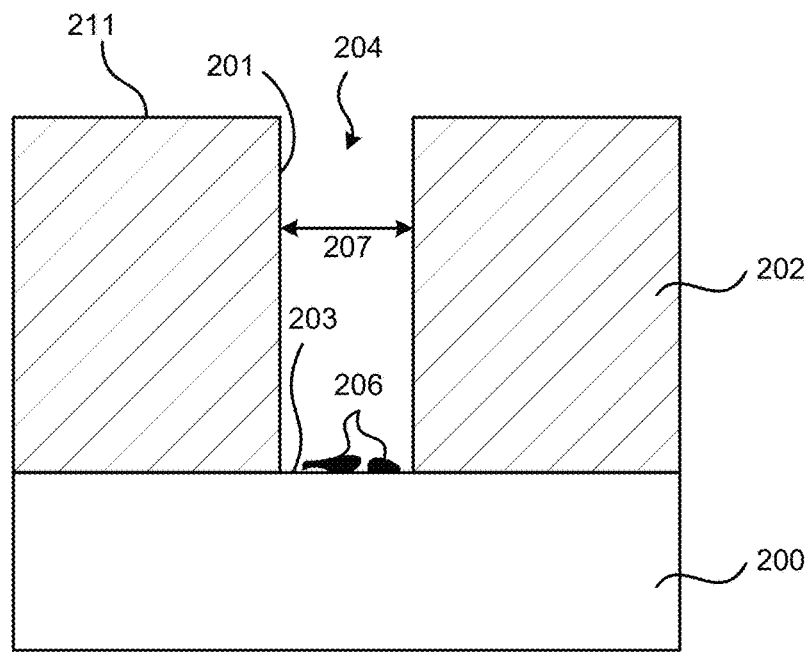
FIGS. 2A-2E schematically show through cross-sectional views a method of processing a substrate according to an embodiment of the invention.

The recessed feature 204 may be formed using well-known lithography and etching processes. Although not shown in FIG. 2A, a patterned mask layer may be present on the field area 211 for defining the opening of the recessed feature 204. Also depicted in FIG. 2A is a residue 206 in the recessed feature 204. The residue 206 can, for example, include etch by-products/etch residue from one or more etch process used to form the recessed feature 204, oxidized material of the substrate 200, or both. The etch by-products can, for example, contain halogen-containing residue from the use of halogen-containing etch gases.

Figure 2B:
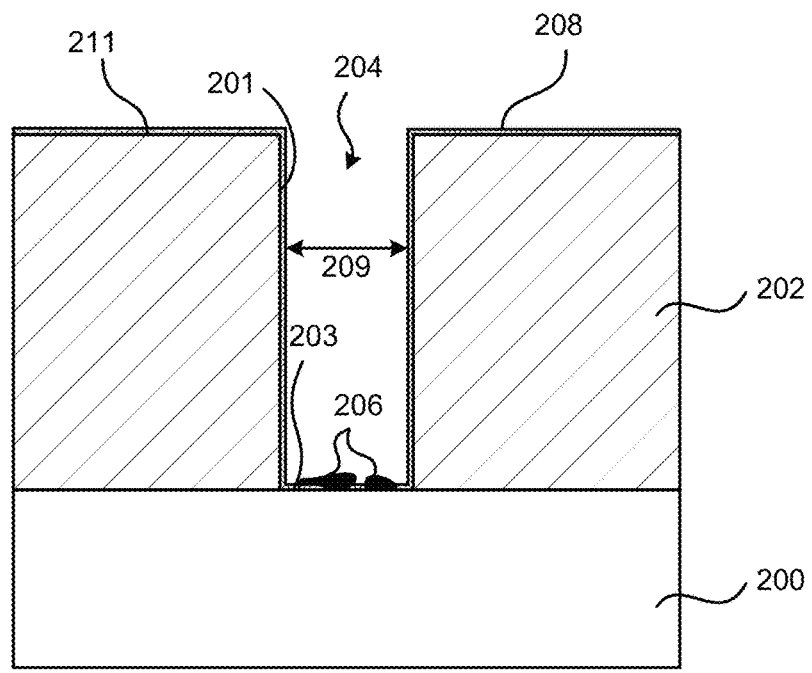

The process flow 1 further includes, in 102, depositing a conformal film 208 on the sidewall 201 and on the bottom portion 203. This is schematically shown in FIG. 2B. According to one embodiment, the conformal film 208 may be deposited by ALD. ALD can deposit very thin films with atomic level thickness control and excellent conformality over advanced raised and recessed features. According to one embodiment, the conformal film 208 can include a metal oxide film. The metal oxide film can be a high-k film. In one example, the metal oxide film may be selected from the group consisting of $HfO_2$, $ZrO_2$, $TiO_2$, $Al_2O_3$, and a combination thereof. However, other metal oxide films may be used. According to another embodiment, the conformal film 208 may be selected from the group consisting of a metal oxide film, a metal nitride film, a metal oxynitride film, a metal silicate film, and a combination thereof.

In one example, the conformal film 208 includes a metal oxide film that is deposited using ALD by a) pulsing a metal-containing precursor into a process chamber containing the substrate 200 and the film 202, b) purging the process chamber with an inert gas, c) pulsing an oxygen-containing precursor into the process chamber, d) purging the process chamber with an inert gas, and e) repeating a)-d) at least once.

A thickness of the conformal film 208 may be selected to provide adequate protection against etching of the sidewall 201 during a cleaning process that is performed to remove the residue 206 and possibly other contaminants from the recessed feature 204. In some examples, a thickness of the conformal film 208 can be 10 nm or less, 5 nm or less, 4 nm or less, between 1 nm and 2 nm, between 2 nm and 4 nm, between 4 nm and 6 nm, between 6 nm and 8 nm, or between 2 nm and 6 nm. The presence of the conformal film 208 on the sidewall 201 reduces the width 207 of the recessed feature 204 to a width 209. However, this change in width is relatively small since the conformal film 208 may be only a few nm thick.

Figure 2C:
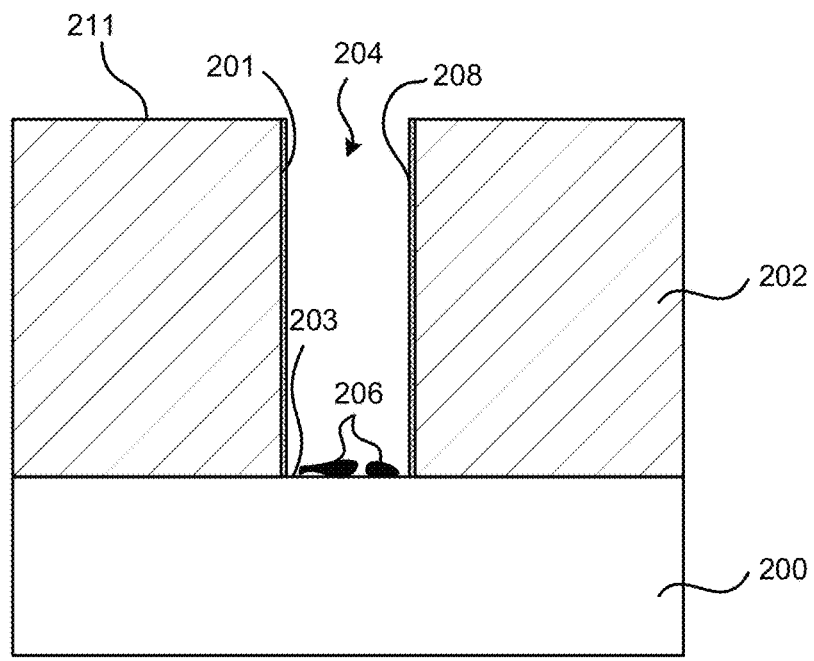

The process flow 1 further includes, in 104, removing the conformal film 208 from the bottom portion 203 and from the field area 211 in an anisotropic etching process, where the remaining conformal film forms a protection film 214 on the sidewall 201. This is schematically shown in FIG. 2C.

The anisotropic etching process may utilize a dry etching process that is directional and thus etches the conformal film 208 faster from the field area 211 and from the bottom portion 203 than from the sidewall 201. In one example, the anisotropic etching process can include a digital etching process or an atomic layer etching (ALE) process. According to one embodiment, the digital etching process can include alternating exposures of $BCl_3$ gas and plasma-excited argon gas. In some examples, a thickness of the protection film 214 can be 4 nm or less, 3 nm or less, 2 nm or less, between 1 n and 2 nm, between 2 nm and 4 nm, between 2 nm and 3 nm, or between 3 nm and 4 nm.

Figure 2D:
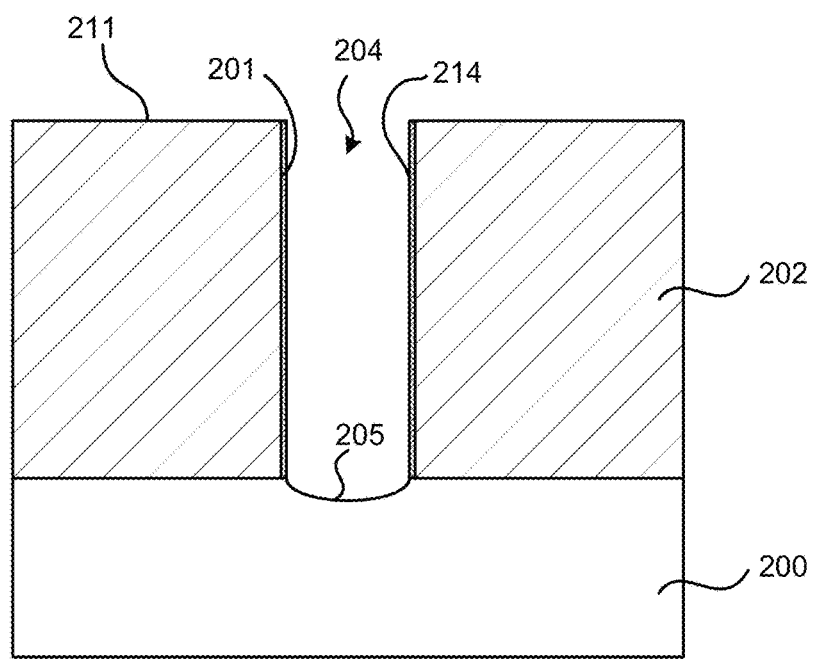
Figure 2E:
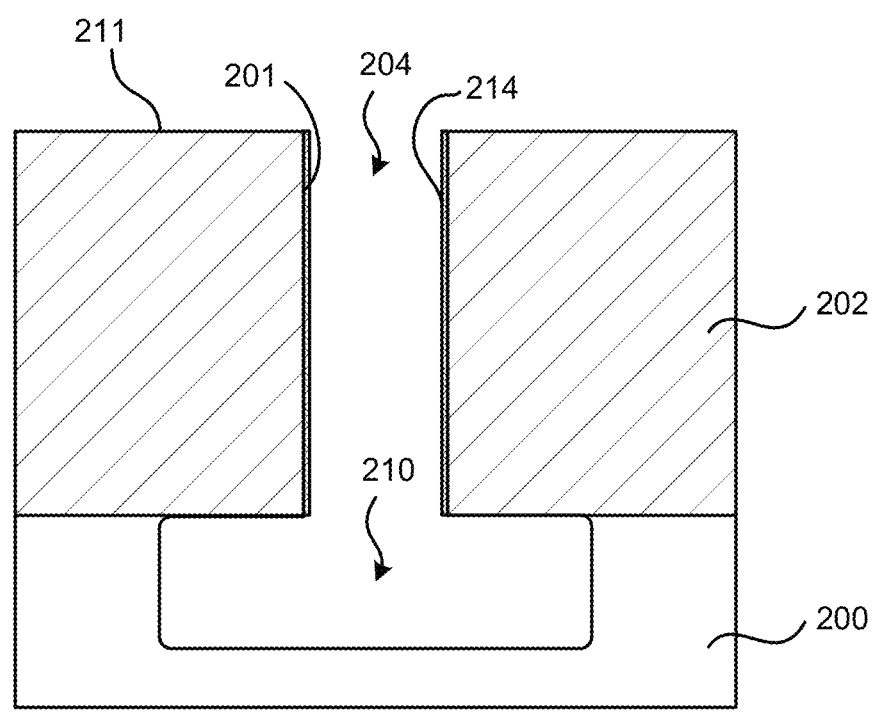

The process flow 1 further includes, in 106, performing a cleaning process that removes the residue 206 from the recessed feature 204 without substantially etching the protection film 214 or the sidewall 201. As depicted in FIG. 2D, the cleaning process removes the residue 206 and the cleaning process may further etch the bottom portion 203 to form a cavity 205 below the protection film 214. The protection film 214 has adequate thickness and etch resistance to prevent or reduce etching of the sidewall 201 during the cleaning process, thus preventing loss of CD.

According to one embodiment, the cleaning process includes a wet cleaning process. The wet cleaning process can, for example, include aqueous HCl, aqueous $H_2O_2$, aqueous HF, aqueous $NH_4OH$, aqueous $H_3PO_4$, aqueous $H_2SO_4$, or a combination thereof.

According to another embodiment, the cleaning process can include a dry etching process. The dry etching process can include exposing the substrate to a gas containing HF, $NH_3$, $H_2O_2$, a halogen containing gas, or a combination thereof. In one example, the cleaning process can include a chemical oxide removal (COR) process that uses HF and $NH_3$ gas exposures to efficiently remove silicon and oxygen, whiles metal oxides films are not substantially etched. In one example, the substrate 200 contains Si, the film 202 contains $SiO_2$, and the protection film contains a metal oxide, for example $Al_2O_3$. A COR process may be used to etch $SiO_2$ efficiently and at a high rate but $Al_2O_3$ is not significantly etched by the COR process.

According to one embodiment, the cleaning process can include sequential wet cleaning processes and dry cleaning processes, in any order.

According to one embodiment, the substrate 200 may be further processed. In one example, the method further includes performing an isotropic etching process to form a contact region 210 in the substrate 200 below the protection film 214. Although not shown in FIG. 2E, the contact region 210 may contain source and drain contacts, for example 3D fins.

Figure 3A:
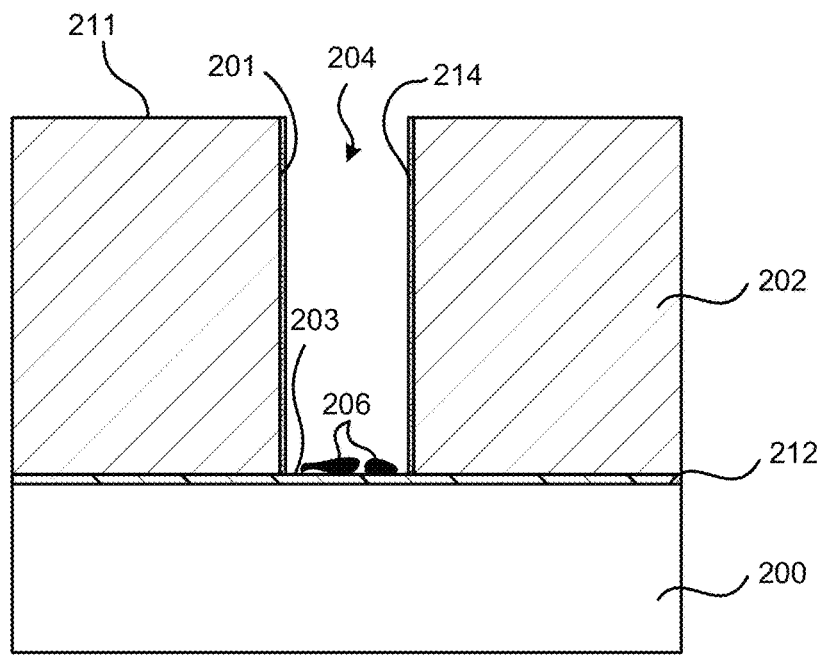
FIGS. 3A-3D schematically show through cross-sectional views a method of processing a substrate according to another embodiment of the invention.
Figure 3B:
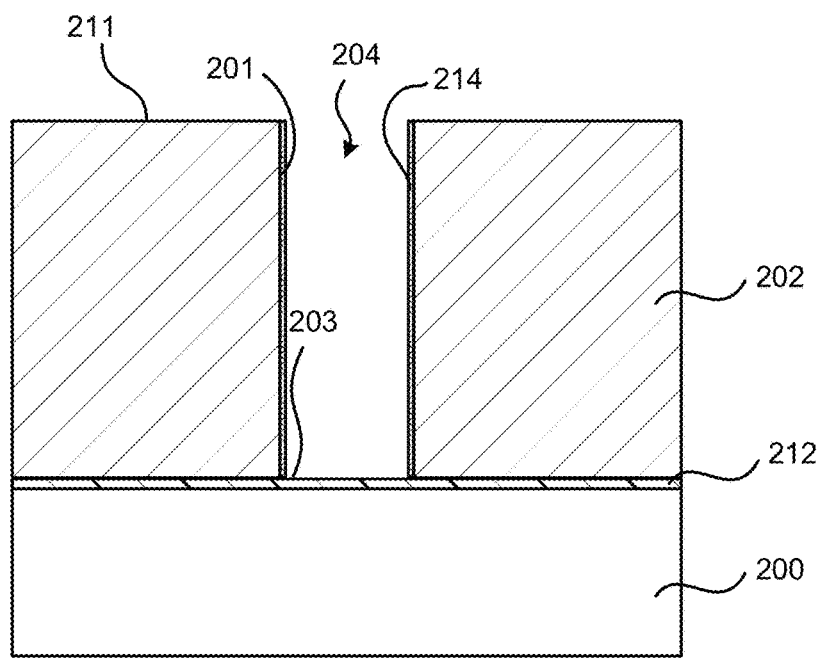
Figure 3C:
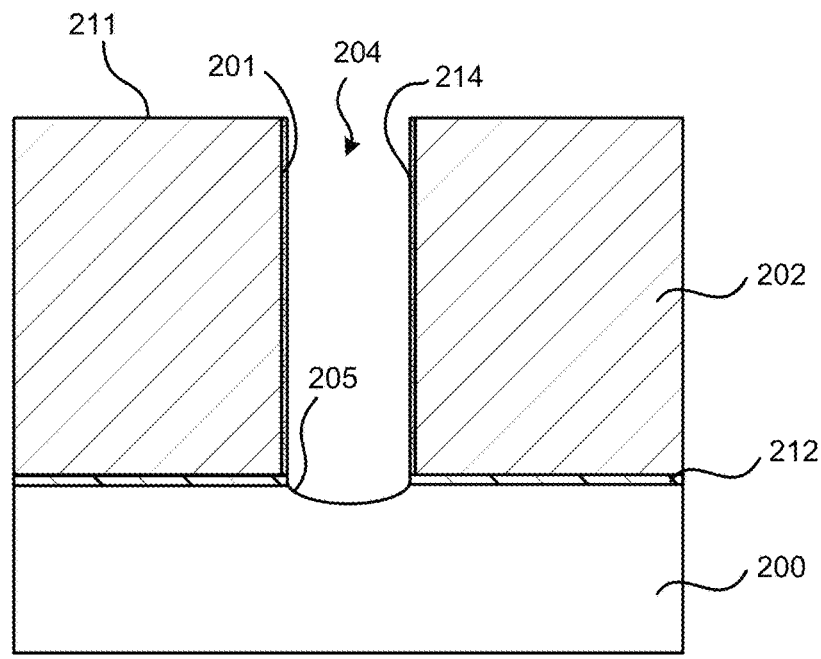
Figure 3D:
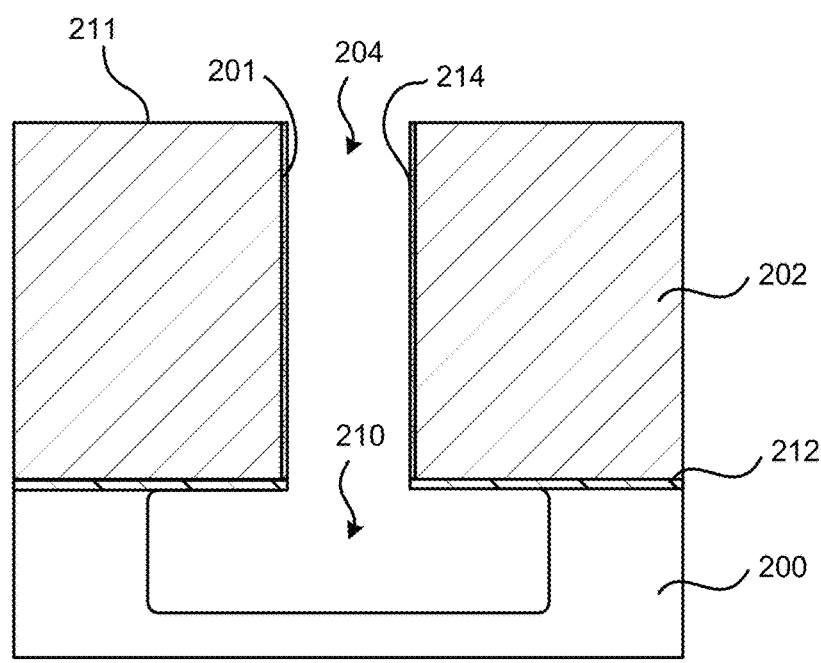

FIGS. 3A-3D schematically show through cross-sectional views a method of processing a substrate according to another embodiment of the invention. The structure depicted in FIG. 3A is similar to the structure depicted in FIG. 2C but further includes an etch stop layer 212 positioned between the film 202 and the substrate 200. The etch stop layer 212 may be used to terminate the etching through the film 202 during the formation of the recessed feature 204. The etch stop layer 212 may, for example, include a high-k material, silicon nitride, silicon oxide, carbon, or silicon. The structure in FIG. 3A may be further processed as described above in FIGS. 2D and 2E. This includes performing a cleaning process that removes residue 206 from the recessed feature 204 without significantly etching the protection film 214 as shown in FIG. 3B and, thereafter, etching through the etch stop layer 212 as shown in FIG. 3C. In one example, the method further includes performing an isotropic etching process to form contact region 210 in the substrate 200 below the etch stop layer 212 and the protection film 214. This is schematically shown in FIG. 3D.

Figure 4A:
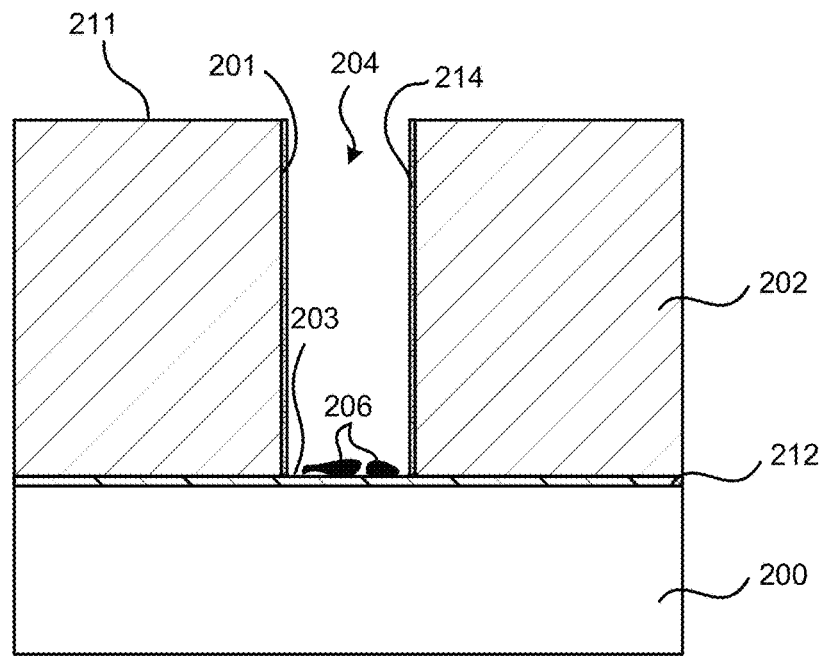
FIGS. 4A-4D schematically show through cross-sectional views a method of processing a substrate according to yet another embodiment of the invention.
Figure 4B:
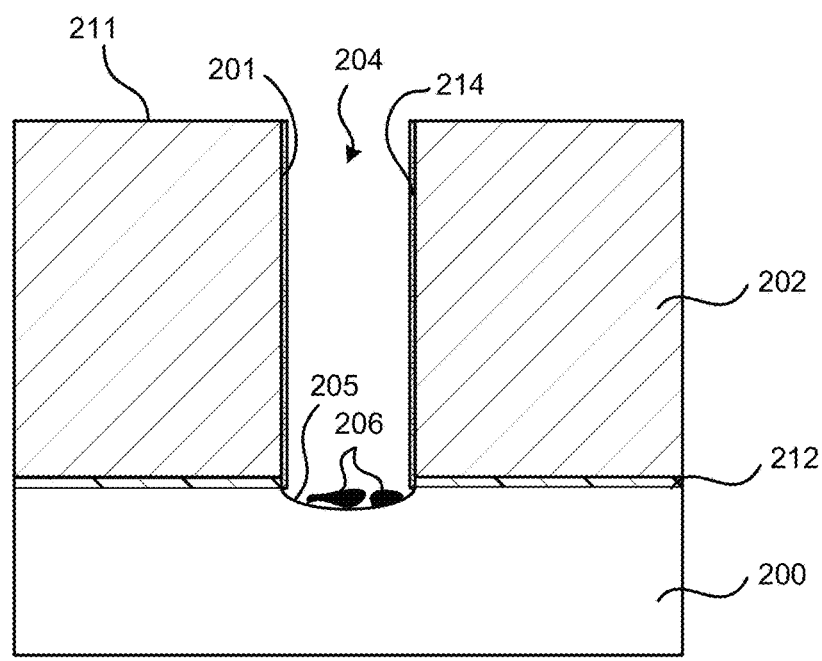
Figure 4C:
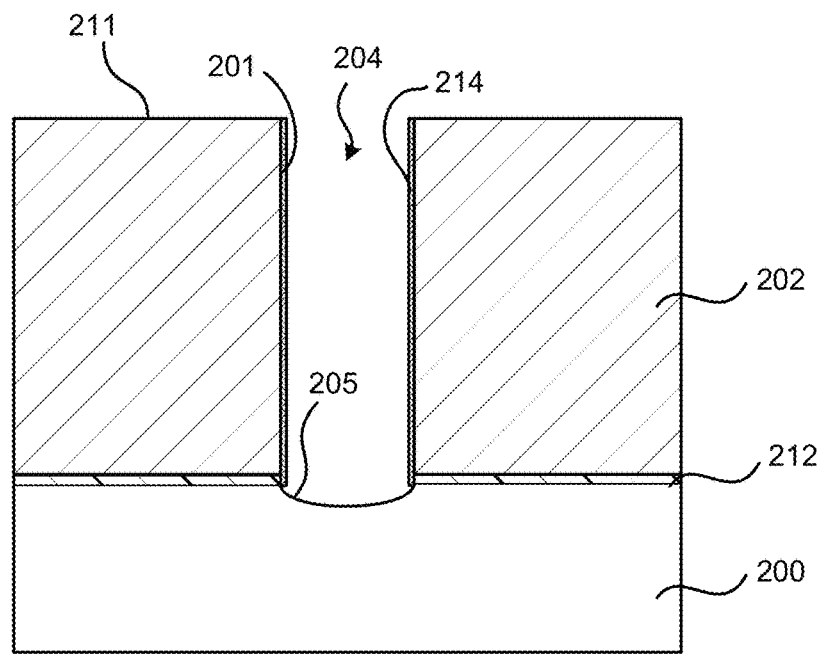
Figure 4D:
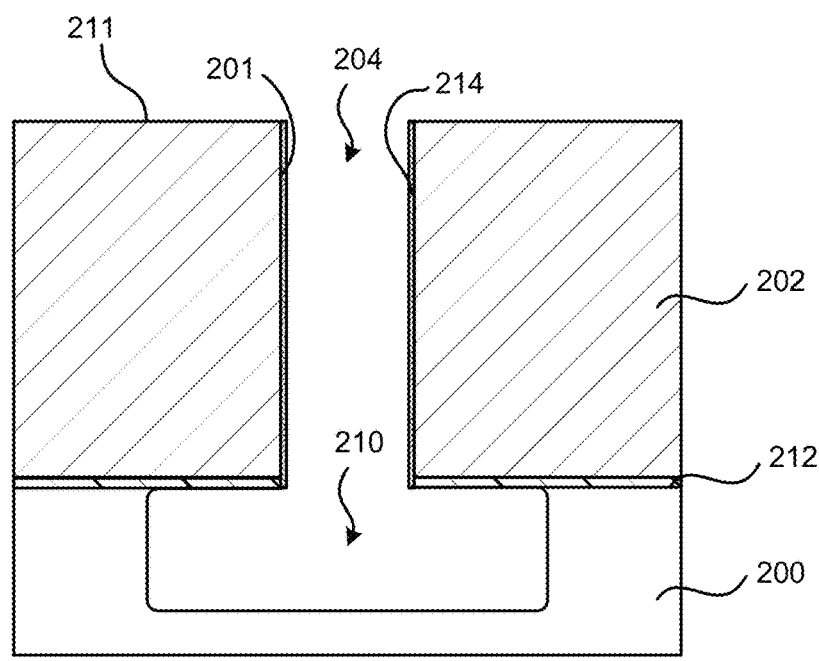

FIGS. 4A-4D schematically show through cross-sectional views a method of processing a substrate according to yet another embodiment of the invention. The structure depicted in FIG. 3A has been replicated in FIG. 4A. The structure in FIG. 4A may be further processed by etching through the etch stop layer 212 as schematically shown in FIG. 4B and, thereafter, performing a cleaning process that removes residue 206 from the recessed feature 204 without etching the protection film 214. This is schematically shown in FIG. 4C. In one example, the method further includes performing an isotropic etching process to form a contact region 210 in the substrate 200 below the etch stop layer 212 and the protection film 214. This is schematically shown in FIG. 4D.

Figure 5C:
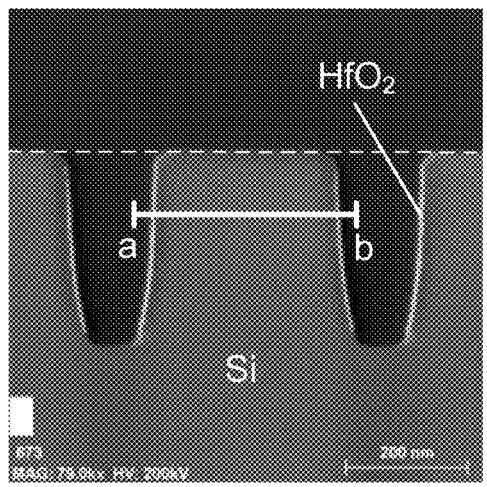
Figure 5C:
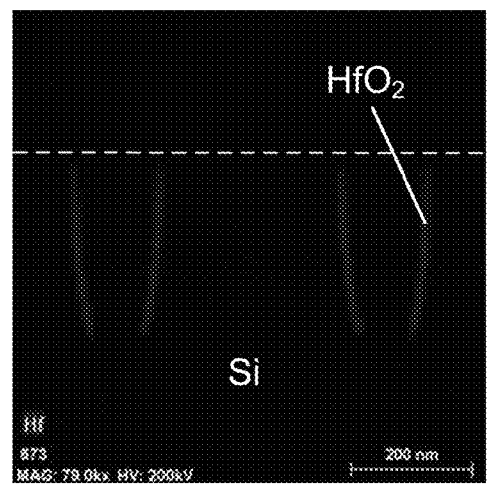
Figure 5C:
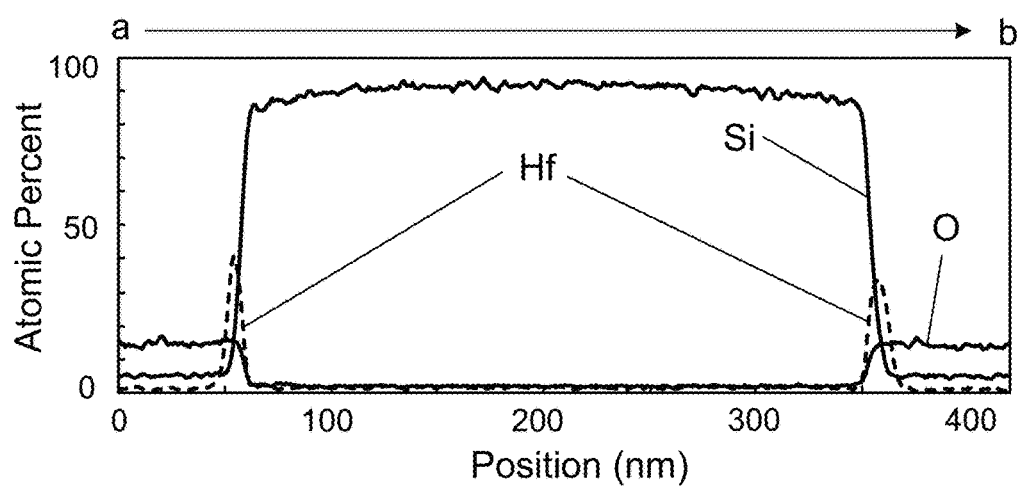

FIGS. 5A-5F show experimental results for forming a $HfO_2$ protection film in recessed features according to an embodiment of the invention. The $HfO_2$ protection film was formed by depositing a conformal $HfO_2$ film by ALD in the recessed features and thereafter performing an anisotropic digital etching process with alternating exposures of $BCl_3$ gas and plasma-excited argon gas to remove the $HfO_2$ film from the field area and from the bottom portion of the recessed features. FIG. 5A shows a TEM graph of the recessed features containing the $HfO_2$ protection film on the sidewalls. The horizontal dotted line indicates the top of the recessed features. FIG. 5B shows a Hf elemental map for the same substrate region as in FIG. 5A and shows that Hf is only present on the sidewalls but not on the field area or in the bottom portion of the recessed features. FIG. 5C shows a chemical composition scan for Hf, Si, and O along the horizontal line from a to b indicated in FIG. 5A. The scan shows the $HfO_2$ protection film on the sidewalls.

Figure 5F:
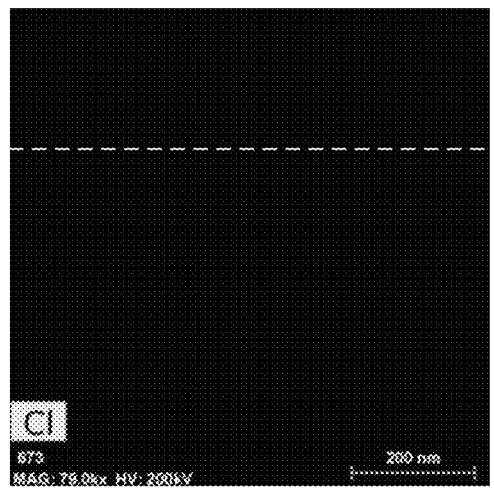
Figure 5F:
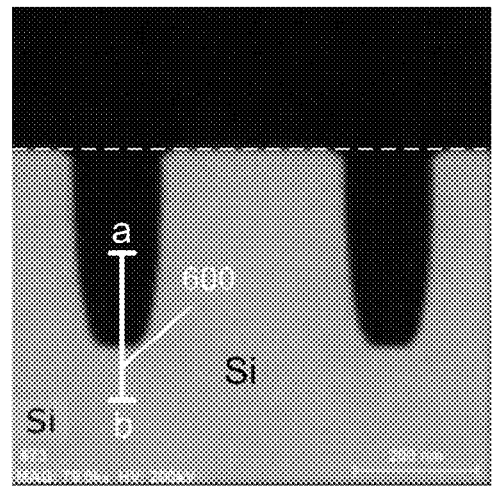
Figure 5F:
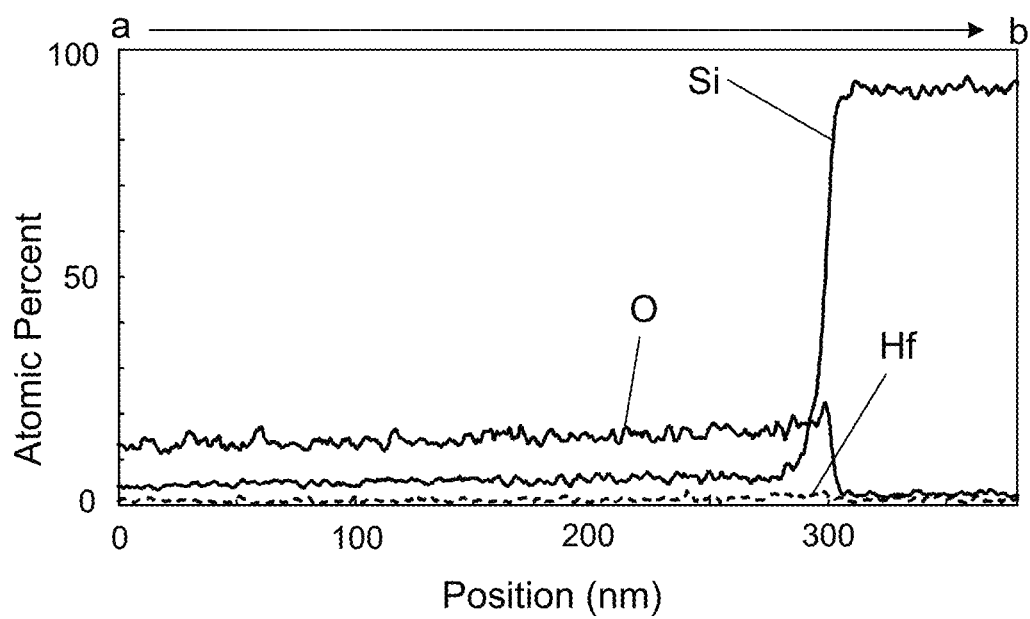

FIGS. 5D and 5E show chemical composition scans for Cl and Si, respectively. No Cl contamination is observed from the anisotropic digital etching process. FIG. 5F shows a chemical composition scan for Hf, Si, and O along the vertical line from a to b indicated in FIG. 5E. The scan shows that no $HfO_2$ is present on the bottom portion of the recessed feature.

Figure 6C:
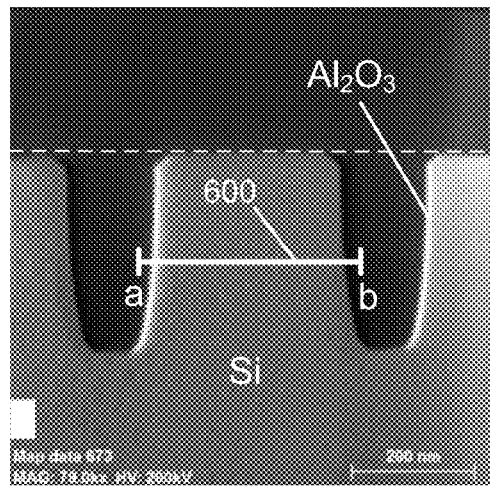
Figure 6C:
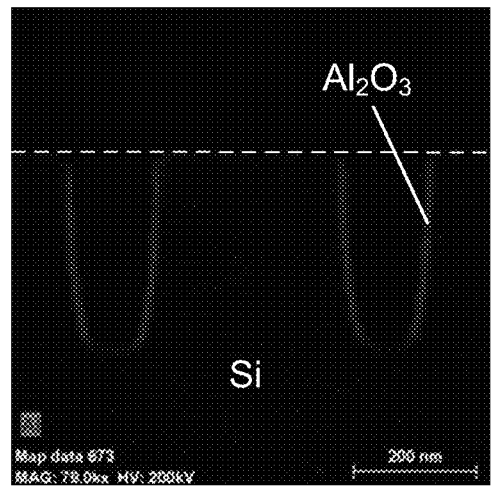
Figure 6C:
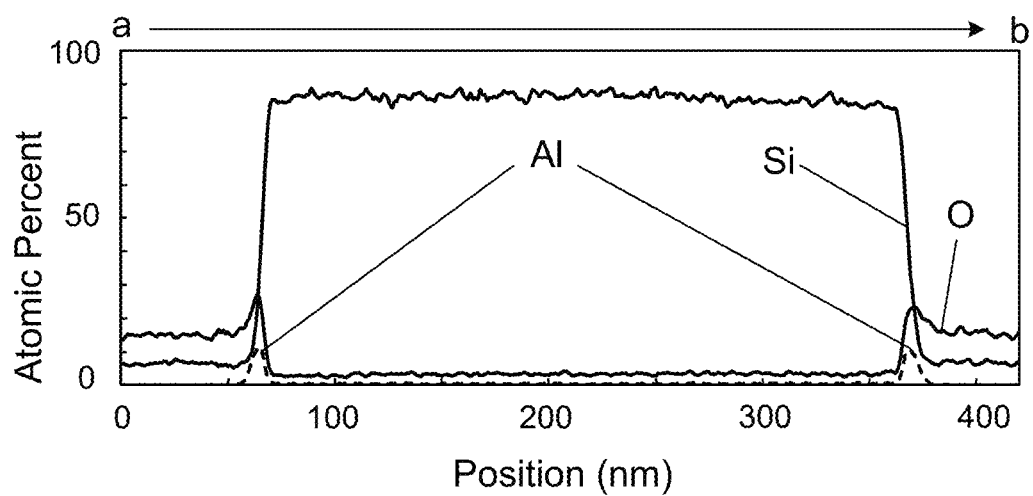

FIGS. 6A-6F show experimental results for forming an $Al_2O_3$ protection film in recessed features according to an embodiment of the invention. The $Al_2O_3$ protection film was formed by depositing a conformal $Al_2O_3$ film by ALD and thereafter performing an anisotropic digital etching process with alternating exposures of $BCl_3$ gas and plasma-excited argon gas to remove the $Al_2O_3$ film from the field area and from the bottom portion of the recessed features. FIG. 6A shows a TEM graph of the recessed features containing the $Al_2O_3$ protection film on the sidewalls. The horizontal dotted line indicates the top of the recessed features. FIG. 6B shows an Al elemental map for the same substrate region as in FIG. 6A and shows that Al is only present on the sidewalls but not on the field area or in the bottom portion of the recessed features. FIG. 6C shows a chemical composition scan for Al, Si, and O along the horizontal line from a to b indicated in FIG. 6A. The scan shows the $Al_2O_3$ protection film on the sidewalls.

Figure 6D:
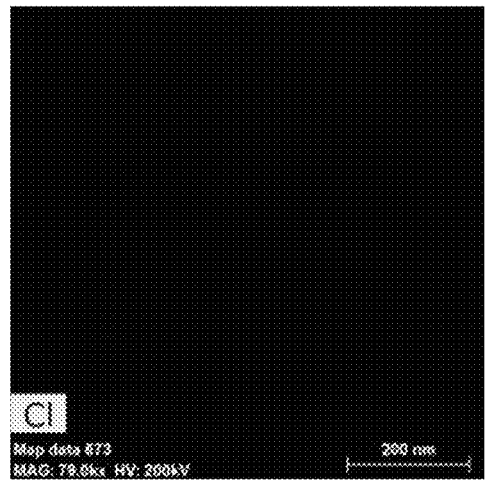
Figure 6E:
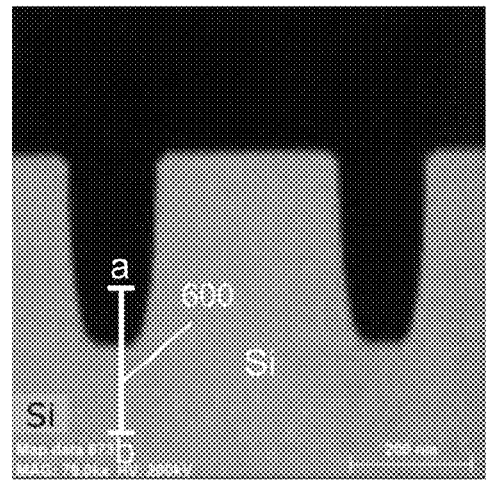
Figure 6F:
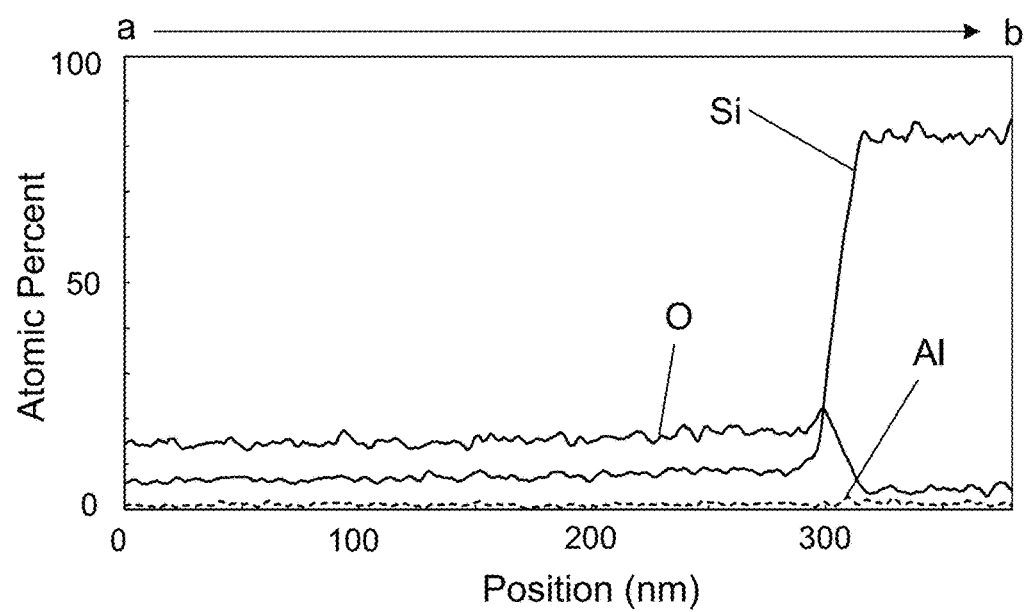

FIGS. 6D and 6E show chemical composition scans for Cl and Si, respectively. No Cl contamination is observed from the anisotropic digital etching process. FIG. 6F shows a chemical composition scan for Al, Si, and O along the vertical line from a to b indicated in FIG. 6E. The scan shows that no $Al_2O_3$ is present on the bottom portion of the recessed feature.

Figure 7A:
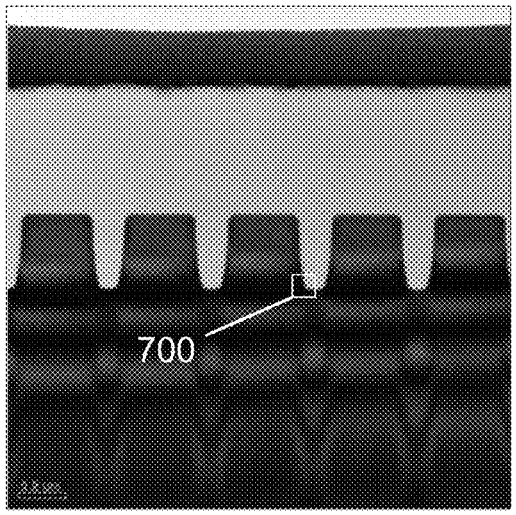
FIGS. 7A-7H show transmission electron microscopy (TEM) graphs of recessed features containing a $HfO_2$ protection film according to an embodiment of the invention.
Figure 7B:
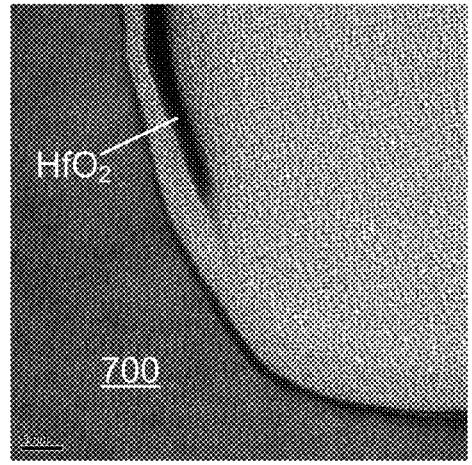
Figure 7C:
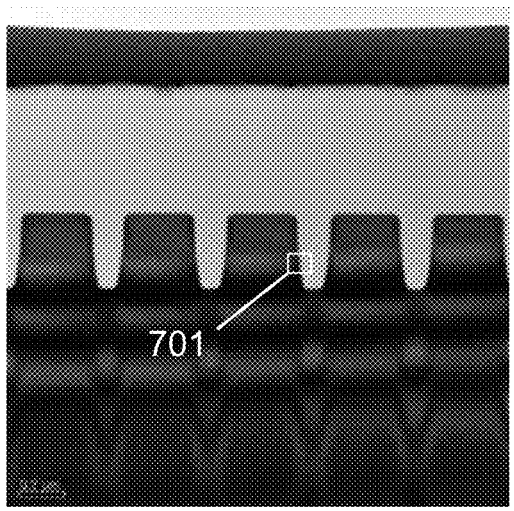
Figure 7D:
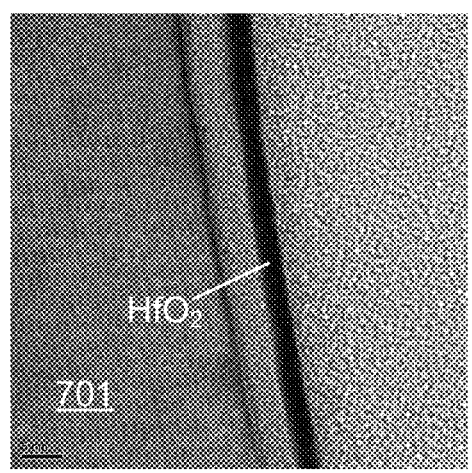
Figure 7E:
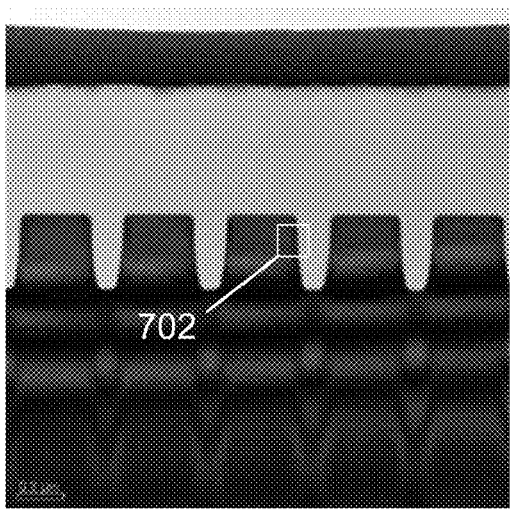
Figure 7F:
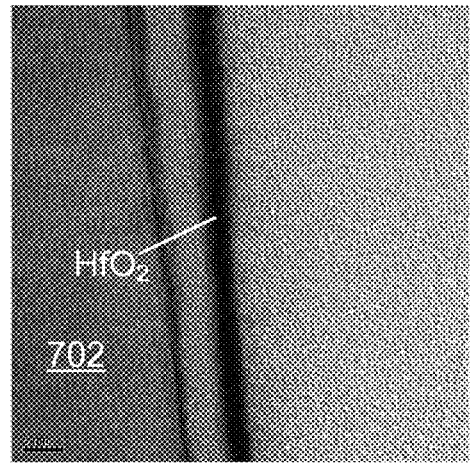
Figure 7G:
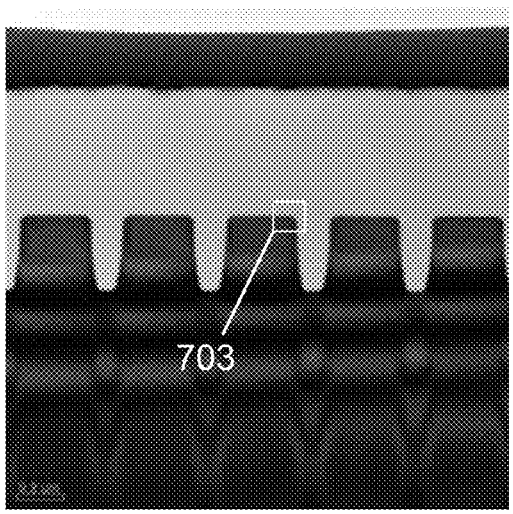
Figure 7H:
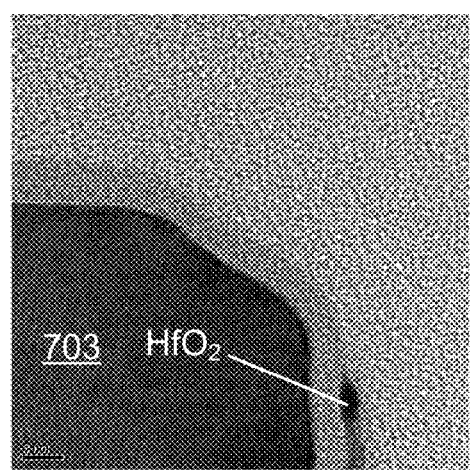

FIGS. 7A-7H show TEM graphs of recessed features containing a $HfO_2$ protection film according to an embodiment of the invention. The region 700 in FIG. 7A is shown in an expanded view in FIG. 7B and shows a $HfO_2$ protection film in dark color on the sidewall of the recessed feature, with no $HfO_2$ present in the bottom portion. The region 701 in FIG. 7C is shown in an expanded view in FIG. 7D and is located higher up on the sidewall of the recessed feature than the region 700 in FIG. 7A. The region 702 in FIG. 7E is shown in an expanded view in FIG. 7F and is located higher up on the sidewall of the recessed feature than the region 701 in FIG. 7C. The region 703 in FIG. 7G is shown in an expanded view in FIG. 7H and shows the top portion of the recessed feature. FIGS. 7A-7H show that the $HfO_2$ protection film is only present on the sidewall of the recessed feature.

Figure 8A:
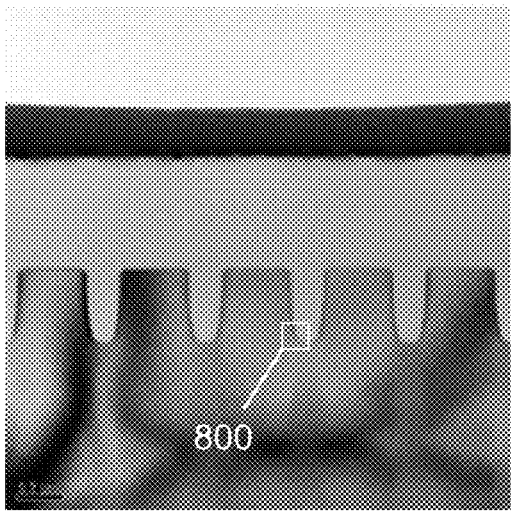
FIGS. 8A-8H show TEM graphs of recessed features containing an $Al_2O_3$ protection film according to an embodiment of the invention.
Figure 8B:
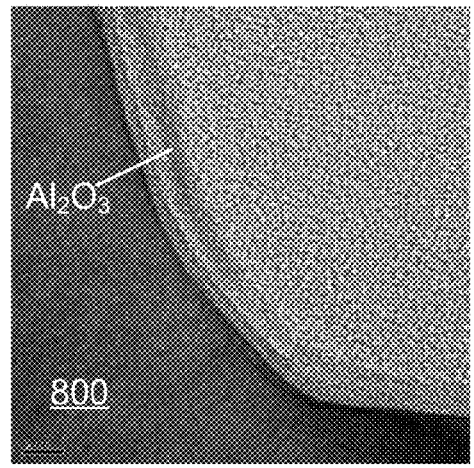
Figure 8C:
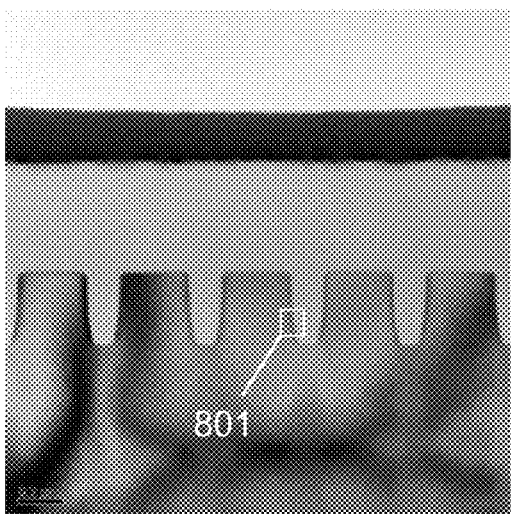
Figure 8D:
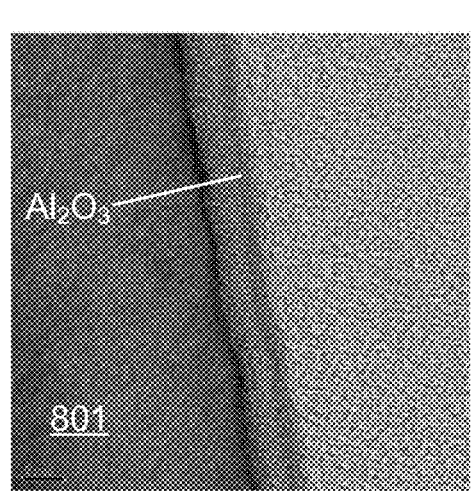
Figure 8E:
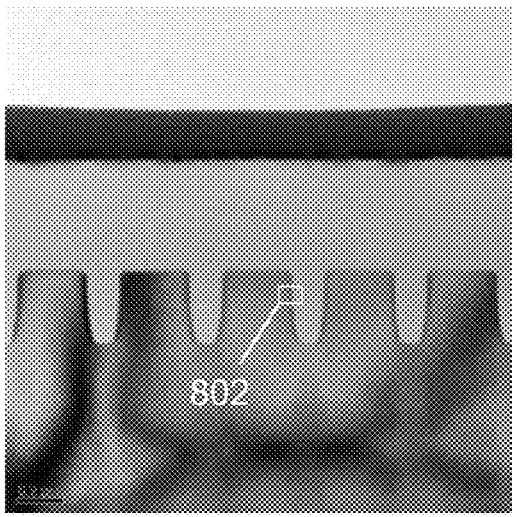
Figure 8F:
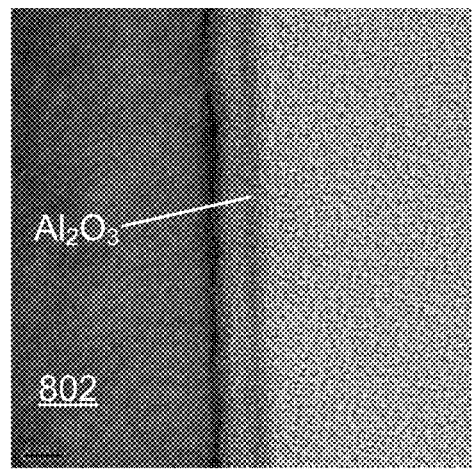
Figure 8G:
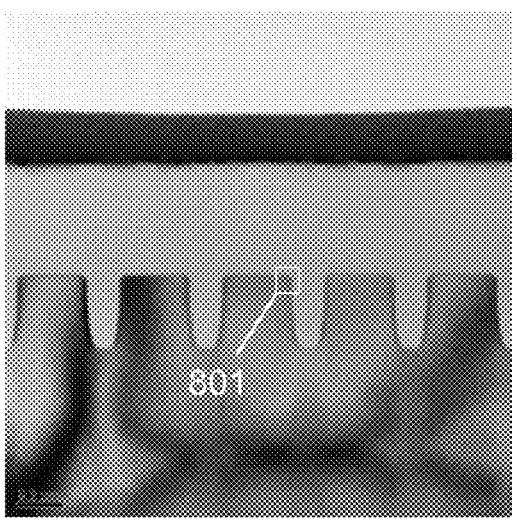
Figure 8H:
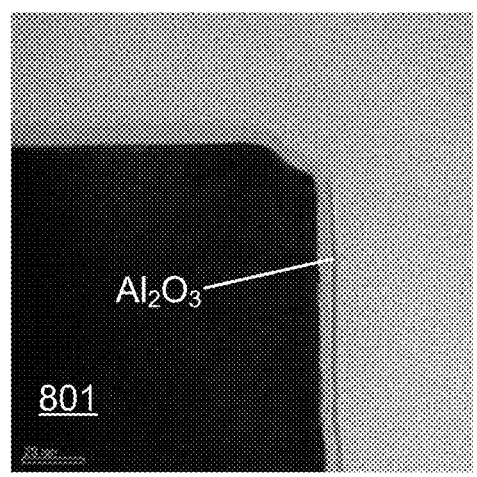

FIGS. 8A-8H show TEM graphs of recessed features containing an $Al_2O_3$ protection film according to an embodiment of the invention. The region 800 in FIG. 8A is shown in an expanded view in FIG. 8B and shows an $Al_2O_3$ protection film in dark color on the sidewall of the recessed feature, with no $Al_2O_3$ present in the bottom portion. The region 801 in FIG. 8C is shown in an expanded view in FIG. 8D and is located higher up on the sidewall of the recessed feature than the region 800 in FIG. 8A. The region 802 in FIG. 8E is shown in an expanded view in FIG. 8F and is located higher up on the sidewall of the recessed feature than the region 801 in FIG. 8C. The region 803 in FIG. 8G is shown in an expanded view in FIG. 8H and shows the top portion of the recessed feature. FIGS. 8A-8H show that the $Al_2O_3$ protection film is only present on the sidewall of the recessed feature.

Figure 9A:
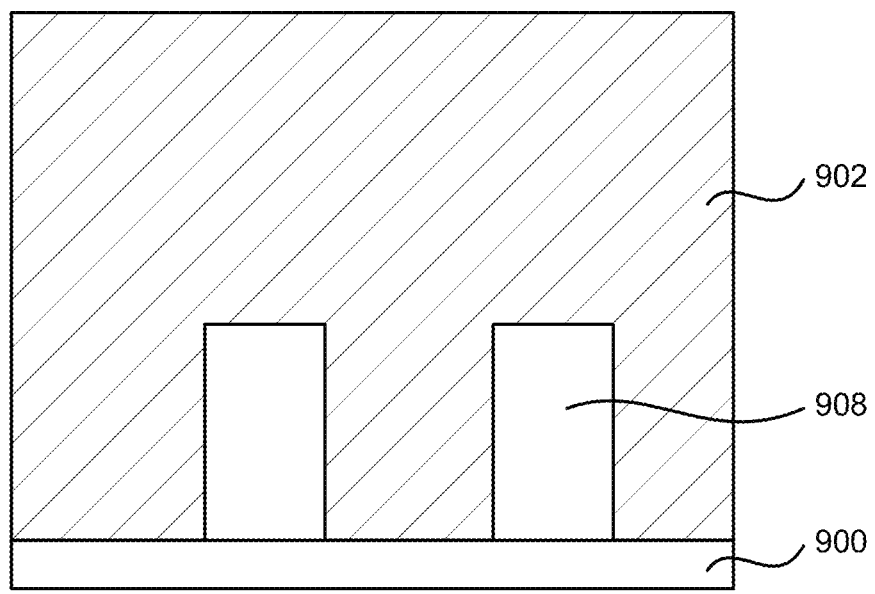
FIGS. 9A-9F schematically show through cross-sectional views a method of processing a substrate according to an embodiment of the invention.
Figure 9B:
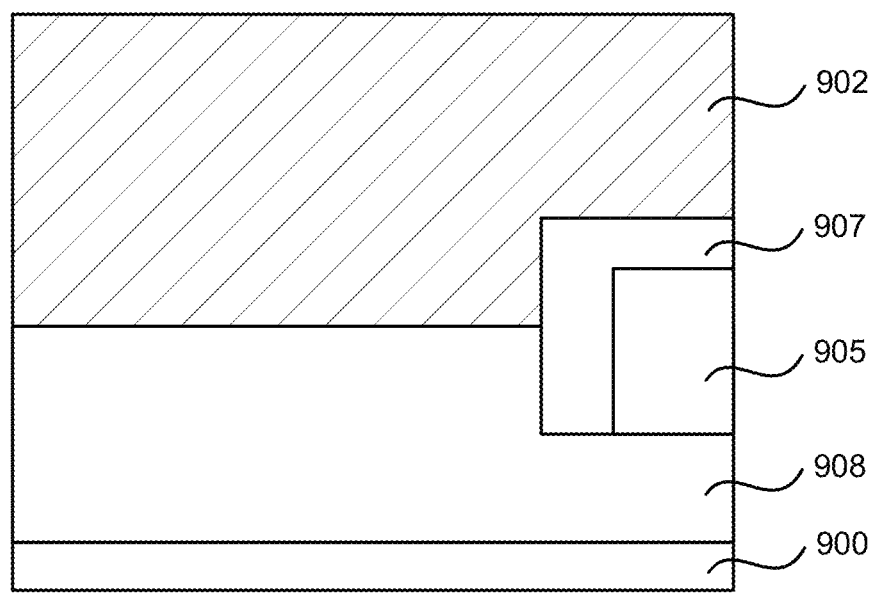

FIGS. 9A-9F schematically show through cross-sectional views a method of processing a substrate according to an embodiment of the invention. FIG. 9A shows a transistor gate stack that may be formed by a replacement metal gate scheme and using a hard mask for self-aligned contact formation. FIG. 9A shows substrate 900 containing a film 902 thereon and 3D fins 908 (e.g., Si) in the film 902. In some examples, the substrate 900 may include Si and the film 202 may contain a dielectric material, for example $SiO_2$. The through-fin view in FIG. 9B is rotated 90 degrees from the across-fin view in FIG. 9A and further shows a metal gate 905 and a nitride layer 907.

Figure 9C:
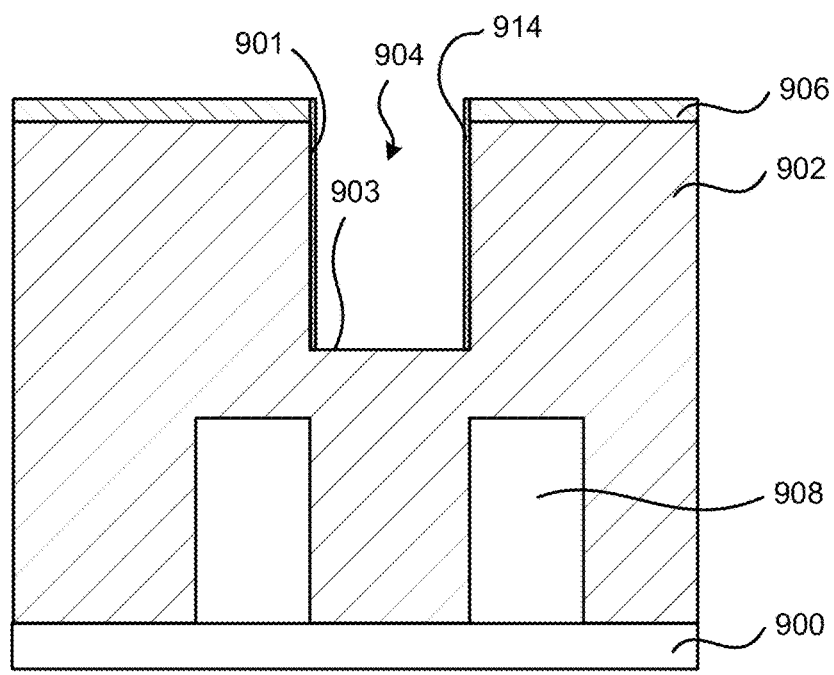
Figure 9D:
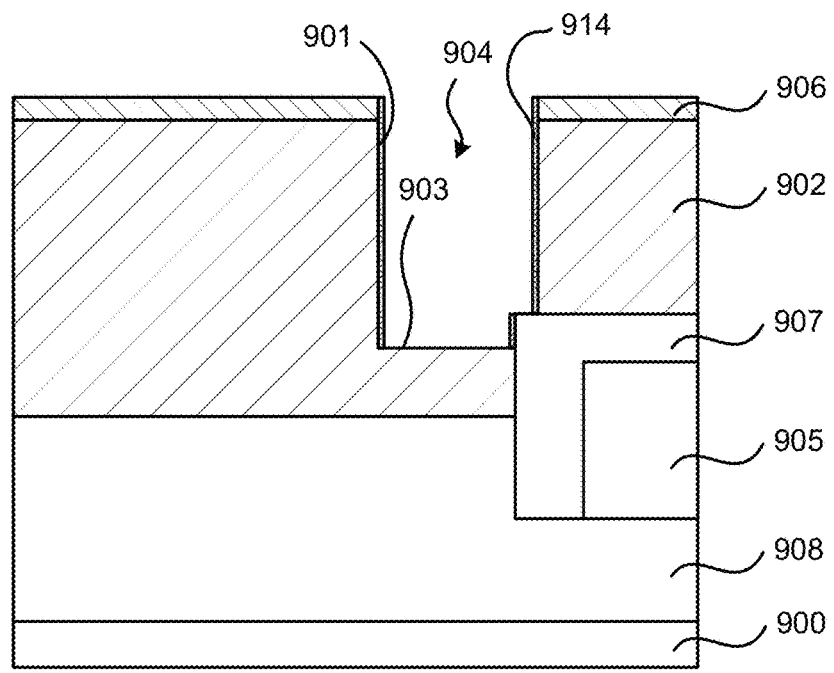

The structure in FIGS. 9A and 9B may be further processed as shown in FIGS. 9C and 9D. The further processing can include depositing a hard mask 906 (e.g., SiN), patterning the hard mask 906, and etching a recessed feature 904 (e.g., a contact hole) in the film 902. As depicted in FIG. 9C, the recessed feature 904 may extend through less than the entire thickness of the film 902. Thereafter, a protection film 914 may be formed on the sidewalls 901 of the recessed feature 904 by depositing a conformal film, and removing the conformal film from the bottom portion 903 and from the top surface of the hard mask 906 in an anisotropic etching process. The through-fin view in FIG. 9D is rotated 90 degrees from the across-fin view in FIG. 9C. Although not shown in FIGS. 9C and 9D, a residue may be present in the recessed feature 904. The residue can, for example, include etch by-products/etch residue from one or more etch process used to form the recessed feature 904. A cleaning process may be performed to remove the residue from the recessed feature 904 without substantially etching the protection film 914. The protection film 914 has adequate thickness and etch resistance to prevent or reduce etching of the sidewall 901 during the cleaning process, thus preventing loss of CD.

Figure 9E:
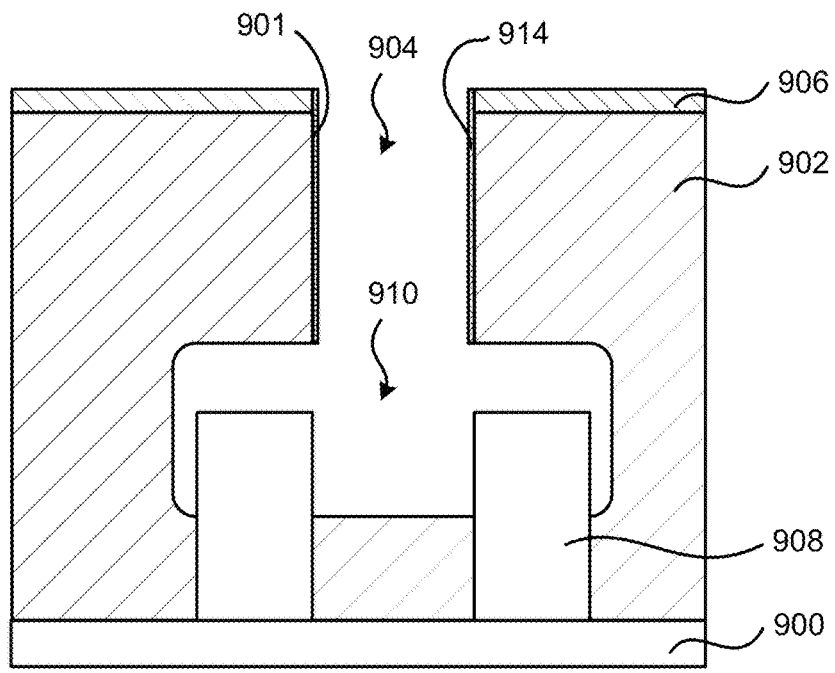
Figure 9F:
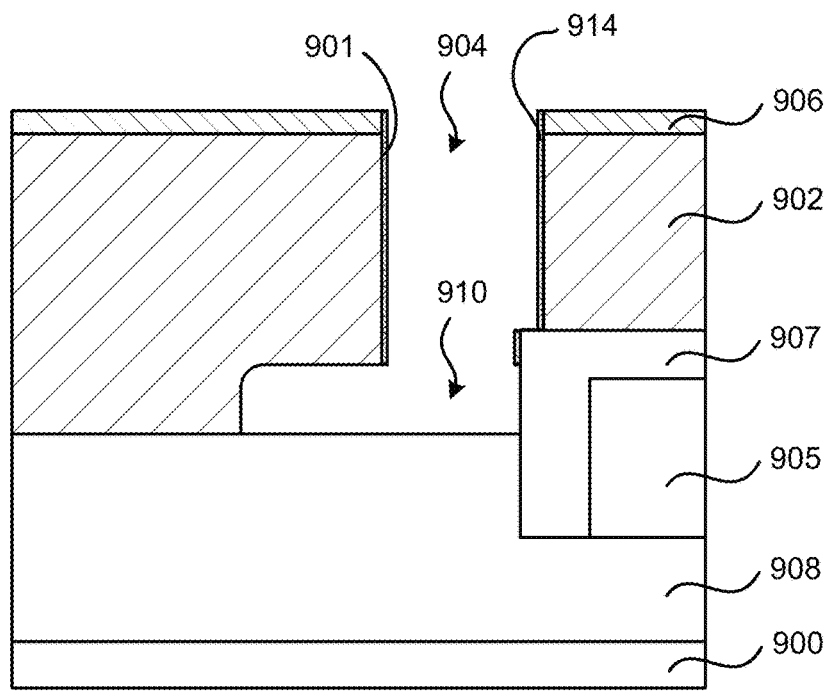

Thereafter, as depicted in FIGS. 9E and 9F, an isotropic etching process may be performed to form a contact region 910 in the film 902 below the protection film 914. The through-fin view in FIG. 9F is rotated 90 degrees from the across-fin view in FIG. 9E.

Figure 10A:
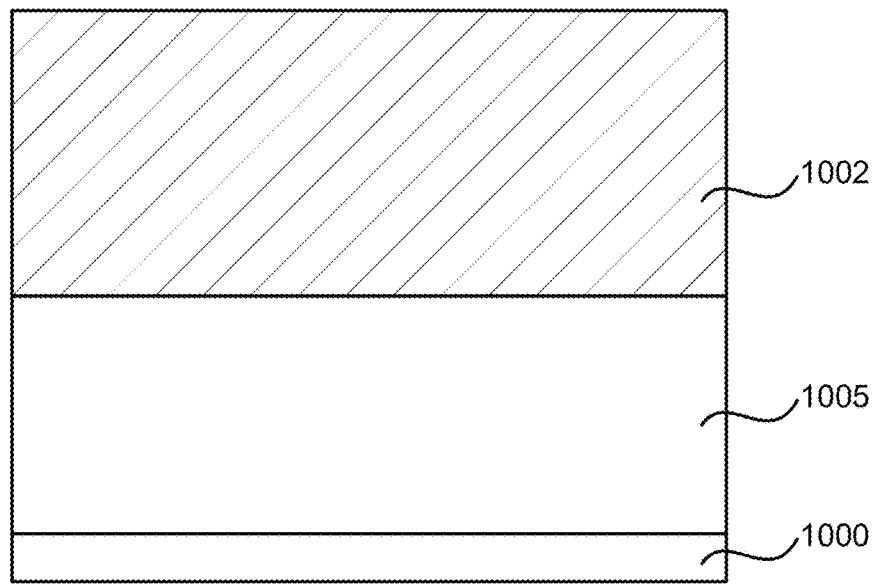
FIGS. 10A-10B schematically show through cross-sectional views a method of processing a substrate according to an embodiment of the invention.
Figure 10B:
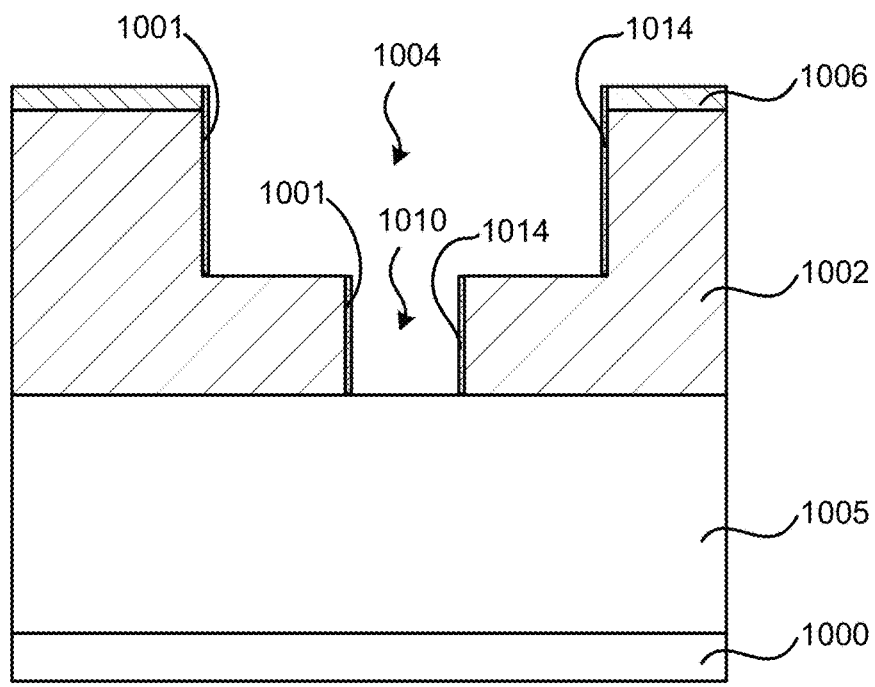

FIGS. 10A-10B schematically show through cross-sectional views a method of processing a substrate according to an embodiment of the invention. FIG. 10A shows a substrate 1000 containing a metal film 1005 thereon and a film 1002 (e.g., $SiO_2$) on the metal film. The metal film 1005 may be a metal interconnect line and the film 1002 may be a back-end dielectric film. The structure in FIG. 10A may be further processed using a dual damascene process as shown in FIG. 10B. The further processing can include depositing a hard mask 1006 (e.g., SiN), patterning the hard mask 1006, and etching recessed features 1004 (e.g., a trench) and 1010 (e.g., a via) in the film 1002. Thereafter, a protection film 1014 may be formed on the sidewalls 1001 by depositing a conformal film, and removing the conformal film from the horizontal surfaces in an anisotropic etching process. Although not shown in FIG. 10B, a residue may be present in the recessed features 1004 and 1010, including etch residue and oxidized metal on the surface of the metal film 1005 in the recessed feature 1010. A cleaning process may be performed to remove the residue from the recessed features 1004 and 1010 without substantially etching the protection film 1014. The protection film 1014 has adequate thickness and etch resistance to prevent or reduce etching of the sidewall 1001 during the cleaning process, thus preventing loss of CD.

Figure 11:
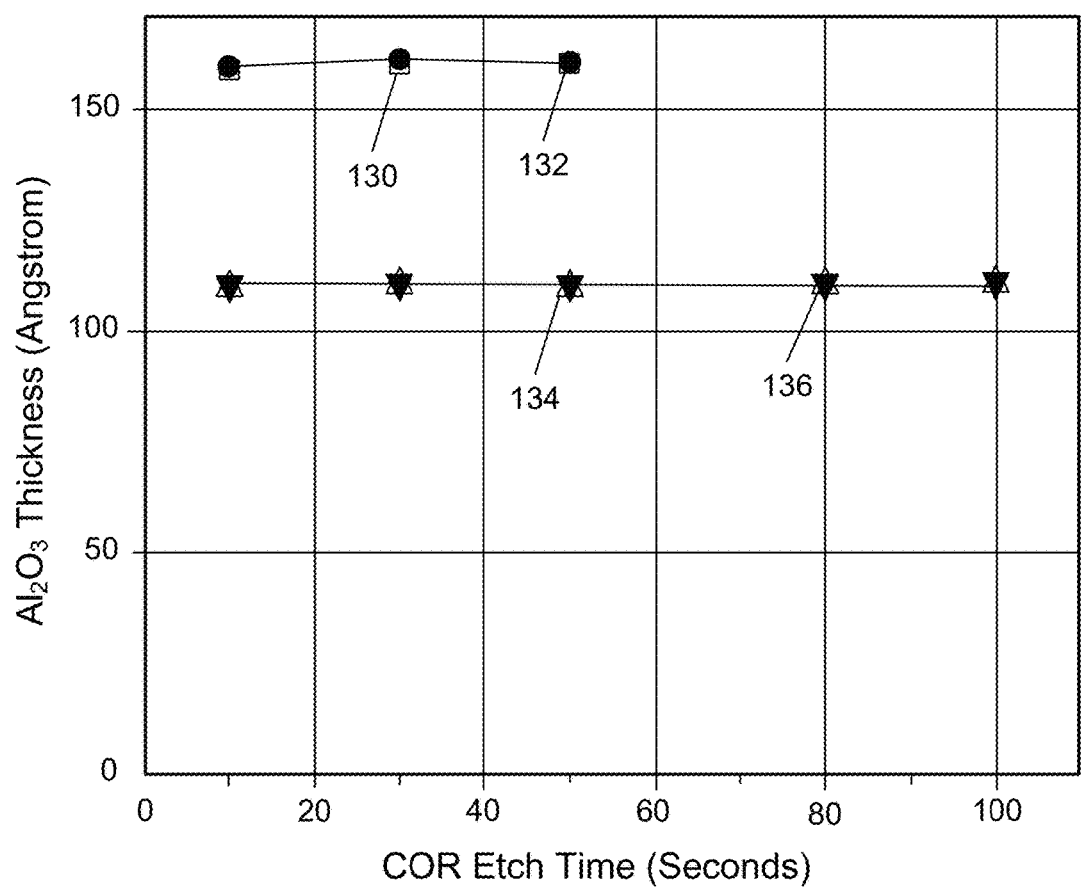
FIG. 11 shows experimental results for a COR process for etching an $Al_2O_3$ film according to an embodiment of the invention.

FIG. 11 shows experimental results for a COR process for etching an $Al_2O_3$ film according to an embodiment of the invention. Traces 130 and 134 show the $Al_2O_3$ film thickness before the COR process, and traces 132 and 134 show the $Al_2O_3$ film thickness after the COR process. The results show that $Al_2O_3$ films were not etched during the COR process and therefore $Al_2O_3$ may be used as a protection film on sidewalls of recessed features.

A plurality of embodiments for sidewall protection of recessed features in semiconductor devices have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A substrate processing method, comprising:
   providing a substrate containing a film thereon having a recessed feature with a sidewall and a bottom portion, the substrate containing an etch residue in the recessed feature;
   depositing a conformal film on the sidewall and on the bottom portion;
   removing the conformal film from the bottom portion in an anisotropic etching process, wherein the remaining conformal film forms a protection film on the sidewall; and
   performing a cleaning process that removes the etch residue from the recessed feature without etching the protection film or the sidewall.

2. The method of claim 1, further comprising following the cleaning process, performing an isotropic etching process to form a contact region below the protection film, the contact region having a width that is greater than a width of the recessed feature.

3. The method of claim 1, wherein the cleaning process further etches the bottom portion to form a cavity below protection film.

4. The method of claim 1, wherein an etch stop layer forms the bottom portion of the recessed feature.

5. The method of claim 4, further comprising
   etching through the etch stop layer prior to performing the cleaning process to remove the residue.

6. The method of claim 4, further comprising
   etching through the etch stop layer after performing the cleaning process to remove the residue.

7. The method of claim 1, wherein the conformal film includes a metal oxide film that is selected from the group consisting of $HfO_2$, $ZrO_2$, $TiO_2$, $Al_2O_3$, and a combination thereof.

8. The method of claim 1, wherein the conformal film is selected from the group consisting of a metal oxide film, a metal nitride film, a metal oxynitride film, a metal silicate film, and a combination thereof.

9. The method of claim 1, wherein the conformal film has a thickness of about 4 nm or less.

10. The method of claim 1, wherein the cleaning process includes a wet cleaning process that uses aqueous HCl, aqueous $H_2O_2$, aqueous HF, aqueous $NH_4OH$, aqueous $H_3PO_4$, aqueous $H_2SO_4$, or a combination thereof.

11. The method of claim 1, wherein the cleaning process includes a dry etching process that includes exposing the substrate to a gas containing HF, $NH_3$, $H_2O_2$, a halogen-containing gas, or a combination thereof.

12. The method of claim 1, wherein the cleaning process includes a chemical oxide removal (COR) process that removes silicon and oxygen.

13. The method of claim 1, wherein depositing the conformal film includes atomic layer deposition (ALD).

14. A substrate processing method, comprising:
    providing a substrate containing a film thereon having a recessed feature with a sidewall and an etch stop layer forming a bottom portion of the recessed feature, the substrate containing an etch residue in the recessed feature;
    depositing a conformal metal oxide film by atomic layer deposition (ALD) on the sidewall and on the bottom portion;
    removing the conformal metal oxide film from the bottom portion in an anisotropic etching process, wherein the remaining conformal metal oxide film forms a protection film on the sidewall; and
    performing a cleaning process that removes the etch residue from the recessed feature without etching the protection film or the sidewall.

15. The method of claim 14, further comprising
    etching through the etch stop layer prior to performing the cleaning process to remove the residue.

16. The method of claim 14, further comprising
    etching through the etch stop layer after performing the cleaning process to remove the residue.

17. The method of claim 14, wherein the metal oxide film is selected from the group consisting of $HfO_2$, $ZrO_2$, $TiO_2$, $Al_2O_3$, and a combination thereof.

18. The method of claim 14, wherein the cleaning process includes a wet cleaning process that uses aqueous HCl, aqueous $H_2O_2$, aqueous HF, aqueous $NH_4OH$, aqueous $H_3PO_4$, aqueous $H_2SO_4$, or a combination thereof.

19. The method of claim 14, wherein the cleaning process includes a dry etching process that includes exposing the substrate to a gas containing HF, $NH_3$, $H_2O_2$, a halogen-containing gas, or a combination thereof.

20. The method of claim 14, wherein the protection film has a thickness of about 2 nm or less.

* * * * *